Dec. 30, 1958 L. E. BARTON 2,866,892

DETECTOR CIRCUIT IN WHICH INCREASING RECTIFIED SIGNAL CAUSES DECREASING COLLECTOR CURRENT

Filed Jan. 25, 1955 2 Sheets-Sheet 1

INVENTOR.
LOY E. BARTON
BY
H. L. Newton
ATTORNEY

Dec. 30, 1958 L. E. BARTON 2,866,892

DETECTOR CIRCUIT IN WHICH INCREASING RECTIFIED SIGNAL CAUSES DECREASING COLLECTOR CURRENT

Filed Jan. 25, 1955 2 Sheets-Sheet 2

INVENTOR.
LOY E. BARTON
BY H. L. Houston
ATTORNEY 2,866,892

DETECTOR CIRCUIT IN WHICH INCREASING RECTIFIED SIGNAL CAUSES DECREASING COLLECTOR CURRENT

Loy E. Barton, Princeton, N. J., assignor to Radio Corporation of America, a corporation of Delaware Application January 25, 1955, Serial No. 484,028

6 Claims. (Cl. 250—20)

Figure 1:
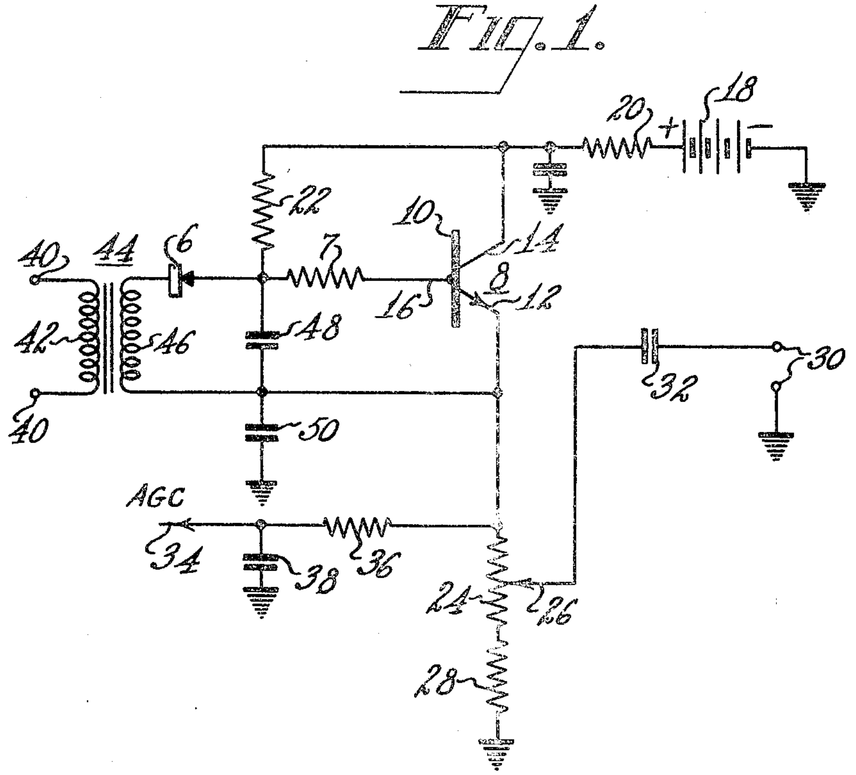

This invention relates, in general, to radio signal receiving systems and in particular to radio signal receiving systems employing semi-conductor devices such as transistors as active signal amplifying and translating elements thereof.

Radio signal receiving systems employing either transistors or vacuum tubes, or both, as the signal amplifying and translating elements, as is well known and understood, must be provided with some means for detecting or demodulating received signals. That is, some means must be provided for deriving from the carrier wave the original modulating signal which was applied at the transmitter. This is often accomplished by a diode rectifier. A load resistor is provided for the diode in the usual case and the rectified load voltage which is derived represents a linear reproduction of the carrier wave envelope.

Signal receiving systems of the type described are also often provided with an automatic gain control (AGC) system. By providing an AGC system for a receiver, it may be tuned from strong to relatively weak signals without the necessity of resetting the manual gain or volume control. To prevent distortion of the output signal, where AGC is employed, the AGC control potentials preferably should be prevented from being excessive.

In addition to automatic gain or volume control, the average commercial radio receiver is also provided with manual means for varying the amplitude of the output signal. Generally, this volume control means comprises a variable resistor or potentiometer which may be in circuit, for example, with the output electrode of one of the audio amplifier stages. The audio amplifier stage usually is arranged so that in the absence of an applied signal its output current is at a minimum and for maximum signal its output current is also at a maximum.

Signal distortion and unstable circuit operation are two of the problems which are associated with the design and optimum operation of radio signal receivers of the type described. As an example, there is a danger that the internal impedance of the supply battery may serve as a coupling element between various portions of the circuit. Thus, audio frequency signals of relatively high amplitude may be coupled through the internal impedance of the battery and fed back in proper phase to cause circuit oscillation. There is also a danger that intermediate frequency harmonic signals may be fed back to the input of the receiver, resulting in instability and signal distortion.

It is, accordingly, an object of the present invention to provide means in a radio signal receiving system employing transistors as active signal amplifying and translating elements for reducing undesired signal distortion and circuit instability.

It is another object of the present invention to provide an improved diode rectifier signal detector circuit in a transistorized radio signal receiver wherein undesired signal feedback is minimized.

It is a still further object of the present invention to provide an improved diode rectifier signal detector circuit and transistor automatic gain control supply circuit for a radio signal receiver wherein the AGC control potentials are prevented from becoming excessive, and signal distortion is substantially eliminated.

It is yet another object of the present invention to provide, in a transistorized radio receiving system, an improved diode detector and combined audio frequency and AGC transistor amplifier circuit wherein undesired feedback is substantially eliminated and stable and distortion-free circuit operation is obtained.

A radio receiving system in which the foregoing and further objects and advantages of the present invention are achieved includes a diode detector which is connected with the base electrode of a transistor which serves as the first audio frequency amplifier and AGC amplifier for the radio receiver. The input impedance of the transistor serves as the load circuit for the diode. The diode is polarized for forward conduction in a direction opposite to that of normal base current flow of the transistor. Thus, in the absence of an applied signal, the collector current flow of the transistor is at a maximum and is reduced as the applied signal increases. By this circuit arrangement the volume control means for the receiver may be placed in the emitter circuit of the transistor, thus reducing audio frequency signal feedback. AGC potentials are also derived in the emitter circuit of the transistor. Such a circuit arrangement provides stable and distortion-free circuit operation.

Figure 2:
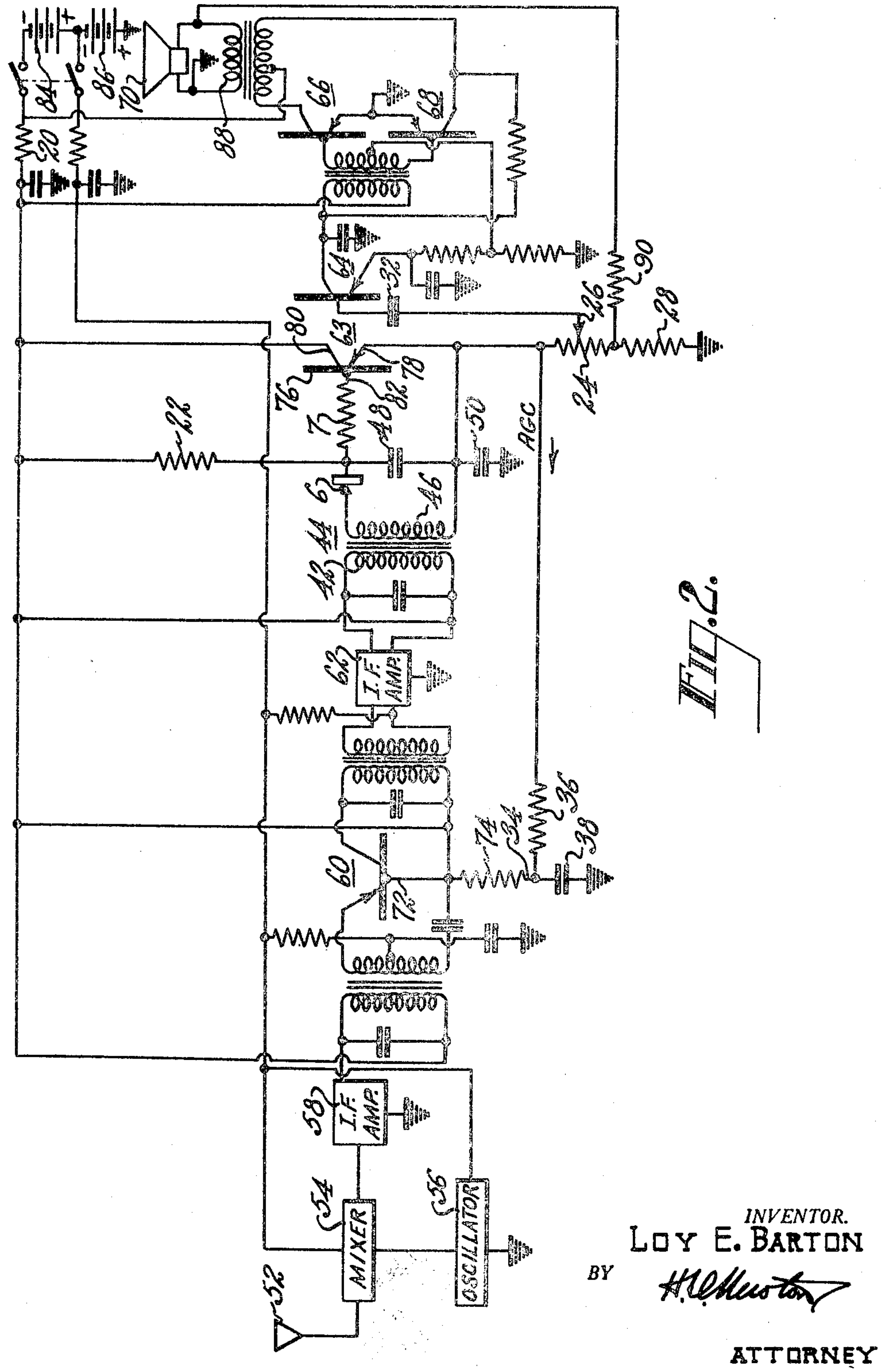

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of the second detector and first audio frequency amplifier and AGC amplifier circuit of a radio signal receiver in accordance with the invention; and Figure 2 is a schematic circuit diagram, partially in block diagram form, of a radio signal receiving system embodying the present invention.

Referring now to the drawing, wherein like parts are indicated by like reference numerals in both figures, and referring particularly to Figure 1, a diode rectifier 6 which may serve, by way of example, as the second detector of a radio signal receiving system, has its anode connected through a resistor 7 to the base 16 of a transistor 8, which may be considered to be a junction transistor of the N–P–N type. The transistor 8 includes a semi-conductive body with which an emitter 12 and a collector 14, in addition to the base 16, are cooperatively associated in a well known manner. The diode 6 is poled, it is to be noted, and in accordance with the invention, for forward conduction in a direction which is opposite to that of normal base current flow of the transistor, which for a transistor of the N–P–N junction type is into the semi-conductive body 10.

Biasing potentials for the transistor 8 and for the diode 6 are provided by a suitable source of direct current potential, such as illustrated by a battery 18, the negative terminal of which is connected to a point of fixed reference potential or ground for the system as shown. The positive terminal of the battery 18 is connected through a resistor 20 to the collector 14 of the transistor 8. In addition, a resistor 22 is connected from the collector 14 to the junction of the diode 6 and the resistor 7. Thus, a forward bias is applied to the diode 6 and the base 16 is maintained at a positive potential.

The emitter 12 of the transistor is connected, in accordance with the invention, through volume control means, comprising a resistor 24 and a variable tap 26, and a second resistor 28 to ground. By this expedient, which is permitted by conecting the diode in the circuit as shown, undesired feedback of audio frequency signals through the internal impedance of the supply battery is prevented. Output signals may be taken from a pair of output terminals 30, one of which is grounded and the other of which is connected through a coupling capacitor 32 to the variable tap 26 of the volume control potentiometer.

AGC potentials are also derived from the emitter circuit of the transistor. To this end, an AGC lead 34 is provided which is connected through filtering means, comprising a series resistor and a by-pass capacitor 38, to the junction of the emitter 12 and the volume control resistor 24.

Input signals such as, for example, intermediate frequency signals, may be applied to the circuit through a pair of input terminals 40 which are connected to either end of the primary winding 42 of an interstage coupling transformer 44. One end of the secondary winding 46 of the coupling transformer 44 is connected to the cathode of the diode detector 36 and the other end is connected directly to the emitter 12 of the transistor 8. The circuit is completed by connecting the anode of the diode detector 46 through a pair of capacitors 48 and 50 to ground. The capacitor 48 is connected from the junction of the anode of diode 6 and the resistor 7 to the junction of the secondary winding 46 and the emitter 12, while the capacitor 50 is connected from the junction of the secondary winding 46 and the emitter 12 to ground. By this expedient undesired intermediate frequency harmonic signals are effectively shunted to ground and undesired intermediate frequency harmonic signal feedback in the circuit is prevented.

In operation, when a signal is applied to the circuit at the input terminals 40, it will be rectified by the diode detector 6. The audio frequency signal will then be amplified by the transistor 8, which also acts, in combination with the resistor 7 as a load for the diode 6. An amplified audio frequency signal may then be derived at the output terminals 30.

In accordance with the invention, the collector current for the audio frequency amplifier and AGC amplifier transistor 8 is at a maximum in the absence of an applied signal. When a signal is applied at the input terminals 40, however, it will be rectified by the diode 6 which causes the direct current flowing into the base 16 of the transistor 8 to decrease. Thus, as the amplitude of the input signal is increased, the collector current of the transistor 8 decreases. Since the collector current of the transistor 8 is at a maximum in the absence of an applied signal, the volume control resistor 24 may be connected in series between the emitter 12 and circuit ground. By this expedient, undesired feedback of audio frequency signals through the internal impedance of the supply battery 18 is prevented. Moreover, since the collector current of the transistor 8 decreases as the input signal is increased, the changes in collector current are always sufficient to accommodate 100% modulation.

In addition to the foregoing advantages, the circuit arrangement is such that the undesired intermediate frequency harmonic signals are easily and effectively shunted to ground through the capacitors 48 and 50. Moreover, for low audio frequency signals, it is to be noted that the direct current and alternating current load for the diode 6 are identical. This, it will be understood, permits circuit operation with a minimum of distortion for high percentage modulation of the applied signal. It has also been found that by provision of a circuit arrangement as shown and described, the biasing potentials for the diode 6 and the transistor 8 are such that reliable circuit operation is insured despite variations in the ambient temperature. Preferably for this purpose the diode 6 will be of the same semi-conductive material as the transistor 8.

As was noted hereinbefore, AGC control potentials are derived from the emitter circuit of the transistor 8 which serves as an AGC amplifier as well as an audio frequency amplifier. Accordingly, as the signal which is applied to the circuit increases in amplitude, the collector current of the transistor 8 will decrease. Thus, as the applied signal increases in amplitude, the voltage on the AGC lead 34 will become more negative. This negative AGC voltage, which varies in accordance with variations of the applied signal, may then be used to control the gain of one or more prior stages, such as the intermediate frequency amplifier stages of the receiver. As was noted hereinbefore, the diode detector 6 is arranged so that the collector current is maximum in the absence of an applied signal. Accordingly, the reductions in collector current of the transistor 8 provide the desired changes in potential for AGC purposes. In this manner, it will be understood that the variations in the AGC potential are prevented from becoming excessive as will be seen more clearly from a consideration of Figure 2. This prevents undesired distortion of the output signal.

A circuit in accordance with the invention is thus seen to be characterized by several important advantages. Undesired signal feedback is substantialy eliminated and signal distortion is minimized. AGC voltages are easily derived and are variable over precisely controlled limits. In addition to these advantages and the others already noted, the circuit arrangement is relatively simple and does not require the use of extra circuit elements.

A circuit of the type described is, of course, ideally suited for use in a radio receiving system. In Figure 2, a radio receiver embodying a circuit of this type includes, in general, an antenna 52, signal mixer 54, a local oscillator 56, a first intermediate frequency amplifier 58, a second intermediate frequency amplifier including a transistor 60, a third intermediate frequency 62, the diode detector 6, an AGC and first audio frequency amplifier transistor 63, a driver transistor 64, a Class B push-pull output circuit including a pair of transistors 66 and 68 and a loudspeaker 70. In the present example, the mixer 54, oscillator 56 and the first and third intermediate frequency amplifiers 58 and 62, respectively, could employ either transistors or tubes, transistors being generally preferred.

To provide the desired AGC action, the gain of the second intermediate frequency transistor amplifier 60 is controlled by variations in the AGC voltage. To this end, the base 72 of this transistor is connected through a resistor 74 to the AGC lead 34. Accordingly, as the AGC voltage is varied due to variations in signal strength, the base voltage of the transistor 60 will also be changed. These base voltage variations will be in such a direction as to reduce the gain of the transistor 60 as the signal increases in amplitude.

In the receiver illustrated in Figure 2, the AGC and first audio frequency amplifier transistor 63 may be considered to be of an opposite conductivity type to its counterpart in Figure 1. Accordingly, the transistor 63 may be considered to be a junction transistor of the P–N–P type or any other suitable type of transistor of N type conductivity. The transistor 63 includes a semi-conductive body 76 with which an emitter 78, a collector 80 and a base 82 are cooperatively associated. Since the transistor 63 is of N type conductivity, the polarity of the diode detector 6 has been reversed so that its cathode is connected through the resistor 7 to the base 82. Accordingly, as in Figure 1, the diode 6 is poled for forward conduction in a direction opposite to that of normal base current flow of the AGC and first audio frequency transistor amplifier 63. The remainder of the circuit is identical to its counterpart in Figure 1.

Biasing potentials for the receiver are provided by a pair of batteries 84 and 86. The batteries 84 and 86 provide biasing potentials for the pair of push-pull transistors 66 and 68, the driver transistor 64, the AGC and first audio frequency transistor amplifier 63 and each of the intermediate frequency amplifier stages. It should be noted, however, that the polarity of the biasing potentials which are applied to the transistor 63, since it is of N type conductivity, are opposite to those illustrated in Figure 1. The battery 86 provides biasing potentials for the oscillator 56 and the mixer 54. Degenerative feedback is provided by connecting a resistor 90 in circuit between the secondary winding 88 of the output transformer to the junction of the volume control resistor 24 and the resistor 28. This expedient, it will be understood, is an aid in reducing distortion.

In operation, the receiver will be recognized to be of the well known superheterodyne type and is operative in accordance with superheterodyne principles. The amplified intermediate frequency signal from the third intermediate frequency amplifier 62 is applied to the diode 6, where it is rectified. The resulting audio frequency signal is amplified by the transistor 63 and coupled through the volume control resistor 24, the tap 26 and the coupling capacitor 32 to the base of the driver transistor 64. The signal in the output circuit of the driver transistor 64 is then used to drive the push-pull output transistors 66 and 68.

As in Figure 1, the collector current of the AGC and first audio frequency transistor amplifier 63 is at a maximum in the absence of an applied signal. As the intermediate frequency signal increases in amplitude, however, the rectified current flowing into the base 82 of the transistor 63 will be increased. This will reduce the collector current of the transistor 63 as the signal is increased. Accordingly, as the signal strength increases, the AGC lead 34 in the emitter circuit of the transistor 63 will become more positive. This will tend to reduce the gain of the intermediate frequency transistor 60 since the forward bias voltage between its emitter and base will decrease toward zero. In this manner, the reductions in collector current of the transistor 63 provide the desired changes in potential for AGC purposes. The collector current of the AGC transistor 63, however, can only decrease to a point where the voltage on its emitter 78 is substantially equal to the voltage of the battery 86. At this point the bias voltage between the emitter and the base of the intermediate frequency amplifier transistor 60 will be zero and the transistor 60 will have minimum gain. Accordingly, the AGC voltage is variable between precise limits. The AGC voltage from the AGC transistor 63 is therefore prevented from becoming too great, which will prevent distortion of the output signal due to excessive reduction in collector current. The circuit in other respects is operative in the same manner as the circuit illustrated in Figure 1 and with the same important advantages.

While it will be understood that the circuit specifications may vary according to the design for any particular application, the following circuit specifications are included for the circuit of Figure 2 by way of example only:

| | |
|---|---|
| Capacitors **48** and **50** ------ | .01 microfarad each. |
| Resistors **7**, **22**, **24** and **28** -- | 3300; 100,000; 10,000; and 12 ohms respectively. |
| Batteries **84** and **86** ------ | 4.5 volts each. |

A radio signal receiving system embodying circuits of the type described herein is stable and efficient in operation. Undesired signal feedback is substantially eliminated by provision of the invention and signal distortion is minimized. Moreover, effective and reliable AGC is easily obtained and may be effectively controlled within definite limits.

What is claimed is:

1. In a radio signal receiving system including a plurality of transistor amplifying stages, an automatic gain control and audio frequency amplifier transistor including a base, an emitter and a collector electrode, a resistor serially connected with said base electrode, signal detection means for said receiver including a diode rectifier serially connected with said resistor to provide a direct-current conductive path between said diode rectifier and said base electrode and reduction in the collector current of said transistor in response to a received signal, said diode being poled for forward conduction in an opposite direction to normal base current flow of said transistor, means including a source of unidirectional potential connected with said collector electrode and to the junction of said resistor and said diode rectifier and of a polarity to provide forward biasing potentials for said diode rectifier, means providing a signal input circuit coupled with said diode rectifier, intermediate frequency by-pass means connected from the junction of said diode rectifier and said resistor to a point of reference potential, direct current conductive means including a volume control resistor connecting said emitter electrode with a point of reference potential, means providing a signal output circuit connected with said volume control resistor, conductive circuit means connected between said emitter electrode and said volume control resistor for deriving an automatic gain control potential, and means for applying said automatic gain control potential to at least one of said transistor amplifying stages to control the gain thereof.

2. In a signal receiver, the combination comprising, a transistor including a base, an emitter, and a collector electrode, signal detection means for said receiver including a diode rectifier, means providing a signal input circuit coupled with said diode for applying an input signal thereto, means direct-current conductively connecting said diode with said base electrode and in circuit with said emitter electrode to apply a detected input signal to said base electrode, said diode being poled for forward conduction in an opposite direction to normal base current flow of said transistor to provide a decrease in collector current flow in response to increases in amplitude of said input signal, means including a volume control impedance element connecting said emitter electrode with a point of reference potential, means providing a signal output circuit coupled with said impedance element, and conductive circuit means connected between said emitter electrode and said impedance element for deriving an automatic gain control potential.

3. In a radio signal receiver, the combination comprising, a transistor including a base, an emitter, and a collector electrode, signal detection means for said receiver comprising a diode rectifier, signal input means connected for applying a modulated signal to said diode, means including said signal input means direct-current conductivity connecting said diode between said base and emitter electrodes for applying a detected signal to said base electrode, said diode being poled for forward conduction in an opposite direction to normal base current flow of said transistor to provide a decrease in collector current flow of said transistor in response to increases in amplitude of said modulated signal, means providing biasing potentials for said transistor and a forward biasing potential for said diode rectifier, direct current conductive means including a volume control impedance element connecting said emitter electrode with a point of reference potential, means providing a signal output circuit connected with said impedance element, conductive circuit means connected between said emitter electrode and said impedance element for deriving an automatic gain control potential, and means for applying said potential to a portion of said receiver to control the gain thereof.

4. In combination with a semi-conductor signal amplifying device including a base, an emitter, and a collector electrode, biasing means connected with said semiconductor device for applying biasing voltages thereto of a magnitude to provide maximum collector current flow in the absence of a received signal, signal detection means including a unilateral conducting device, means providing a signal input circuit coupled with said unilateral conducting device for applying an input signal thereto, means direct-current conductively connecting said unilateral conducting device with said base electrode and in circuit with said emitter electrode to apply a detected signal to said base electrode, said unilateral conducting device being poled for forward conduction in a direction opposite to that of normal base current flow of said semi-conductor signal amplifying device to provide a decrease in collector current flow of said signal amplifying device in response to increases in amplitude of said input signal, means connected with said emitter electrode for deriving a detected output signal from said signal amplifying device, and means connected with said emitter electrode for deriving an automatic gain control signal from said semi-conductor device.

5. In a signal receiver, the combination comprising, a transistor including base, emitter, and collector electrodes, biasing means connected with said transistor for applying biasing voltages thereto of a magnitude to provide maximum collector current flow in the absence of a received signal, signal detection means for said receiver including a diode rectifier, input circuit means connected for applying a modulated signal to said diode rectifier, means direct-current conductively connecting said diode in series between said base and emitter electrodes for applying a detected modulated signal to said base electrode, said diode being poled for forward-conduction in a direction opposite to normal base-emitter current flow of said transistor to decrease the base bias current and collector current flow of said transistor with increases in amplitude of said modulated signal, output circuit means connected with said emitter electrode for deriving an output signal from said transistor, and means connected with said emitter electrode for deriving an automatic gain control signal from said transistor.

6. In a signal receiver, the combination comprising, a transistor including base, emitter, and collector electrodes, signal detection means for said receiver including a diode rectifier, input circuit means connected for applying a modulated signal to said diode rectifier, means direct-current conductively connecting said diode in series between said base and emitter electrodes for applying a detected modulated signal to said base electrode, said diode being poled for forward-conduction in a direction opposite to normal base-emitter current flow of said transistor to decrease the base bias current and collector current flow of said transistor with increases in amplitude of said modulated signal, means providing a direct-current supply source including a pair of terminals, means connecting one of said terminals with said collector for applying a reverse bias voltage thereto of a magnitude to provide maximum collector current flow in the absence of a received signal and with said diode for applying a forward bias voltage thereto, means connecting said emitter electrode with the other of said terminals, means for deriving a detected output signal from between said collector and emitter electrodes, and means for deriving an automatic gain control signal from between said collector and emitter electrodes.

References Cited in the file of this patent

UNITED STATES PATENTS

| | | |
|---|---|---|
| 2,638,538 | Ruben | May 12, 1953 |
| 2,644,896 | Lo | July 7, 1953 |
| 2,662,976 | Pantchechnikoff | Dec. 15, 1953 |

OTHER REFERENCES

Article in Radio Electronics for March 1954, page 82.

Article in Radio and Television News, vol. 53, No. 1, page 54, January 1955 issue (received at the Patent Office December 27, 1954).

Transistor Broadcast Receivers, by Stern and Raper, article in Electrical Engineering, December 1954, pages 1107–1112. (This is text of a paper presented March 22–25, 1954.)

Article in Radio and Television News, October 1953, page 169.